United States Patent
Caulfield et al.

(10) Patent No.: US 10,699,798 B2
(45) Date of Patent: Jun. 30, 2020

(54) TESTING STORAGE DEVICE POWER CIRCUITRY

(71) Applicant: Microsoft Technology Licensing, LLC, Redmond, WA (US)

(72) Inventors: Laura Marie Caulfield, Woodinville, WA (US); Mark Alan Santaniello, Redmond, WA (US); J. Michael Andrewartha, Woodinville, WA (US); John J. Siegler, Carnation, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 129 days.

(21) Appl. No.: 15/369,501

(22) Filed: Dec. 5, 2016

(65) Prior Publication Data
US 2017/0098479 A1     Apr. 6, 2017

Related U.S. Application Data

(62) Division of application No. 14/532,646, filed on Nov. 4, 2014, now Pat. No. 9,558,848.

(51) Int. Cl.
*G11C 29/50*     (2006.01)
*G01R 31/3183*   (2006.01)
(Continued)

(52) U.S. Cl.
CPC .......... *G11C 29/50* (2013.01); *G01R 31/3004* (2013.01); *G01R 31/318342* (2013.01);
(Continued)

(58) Field of Classification Search
CPC ......... G11C 5/147; G11C 29/10; G11C 29/50; G11C 5/14; G11C 16/30;
(Continued)

(56) References Cited

U.S. PATENT DOCUMENTS 6,513,145 B1    1/2003   Venkitakrishnan
7,003,441 B2    2/2006   Venkitakrishnan
(Continued)

FOREIGN PATENT DOCUMENTS

CN    1297231 A    5/2001
CN    1983451 A    6/2007
(Continued)

OTHER PUBLICATIONS

"Communication pursuant to Article 94(3) EPC: EP Examination Report", dated Jun. 28, 2018 (dated Jun. 28, 2018), European Patent Office, for European Application No. 15794749.0-1203, 6pgs.
(Continued)

*Primary Examiner* — April Y Blair
*Assistant Examiner* — Sazzad Hossain
(74) *Attorney, Agent, or Firm* — Buckley, Maschoff & Talwalkar LLC

(57) ABSTRACT

The present invention extends to methods, systems, and computer program products for testing storage device power circuitry. A storage device controller includes an embedded test program. The storage device controller executes the test program in response to receiving a test command. In one aspect, the test program issues a plurality of different command patterns to test shared power circuitry of storage device components (e.g., shared by an array of NAND flash memory devices). The test program identifies a command pattern that causes a greatest total current draw. In another aspect, the test program issues a specified command pattern (possibly repeatedly) to shared power circuitry to determine if the shared power circuitry fails.

19 Claims, 3 Drawing Sheets

(51) Int. Cl.
  G11C 29/02 (2006.01)
  G01R 31/30 (2006.01)
  G11C 29/10 (2006.01)
  G11C 5/14 (2006.01)
  G11C 29/04 (2006.01)
  G11C 16/30 (2006.01)

(52) U.S. Cl.
  CPC .......... *G11C 29/021* (2013.01); *G11C 29/10* (2013.01); *G11C 29/50004* (2013.01); *G11C 5/14* (2013.01); *G11C 5/147* (2013.01); *G11C 16/30* (2013.01); *G11C 2029/0409* (2013.01); *G11C 2029/5004* (2013.01); *G11C 2029/5006* (2013.01)

(58) Field of Classification Search
  CPC .... G11C 2029/0409; G11C 2029/5004; G11C 2029/5006; G11C 29/021; G11C 29/50004; G01R 31/3004; G01R 31/318342
  See application file for complete search history.

(56) References Cited

U.S. PATENT DOCUMENTS

| | | | |
|---|---|---|---|
| 7,251,739 B1* | 7/2007 | Rudelic | G11C 16/10 713/330 |
| 9,558,848 B2* | 1/2017 | Caulfield | G11C 29/50004 |
| 2005/0135258 A1* | 6/2005 | Amrod | H04L 43/50 370/241 |
| 2009/0006915 A1 | 1/2009 | Gomez | |
| 2010/0179784 A1* | 7/2010 | Crosby | G01R 31/318547 702/117 |
| 2011/0173374 A1* | 7/2011 | Hobbet | G06F 1/28 711/103 |
| 2012/0023356 A1 | 1/2012 | Byom et al. | |
| 2012/0216058 A1 | 8/2012 | Wells et al. | |
| 2014/0229666 A1 | 8/2014 | Schoenbord | |
| 2015/0199999 A1* | 7/2015 | Sommer | G11C 5/14 365/226 |

FOREIGN PATENT DOCUMENTS

| | | |
|---|---|---|
| CN | 101401167 A | 4/2009 |
| CN | 101467136 A | 6/2009 |

OTHER PUBLICATIONS

"International Preliminary Report on Patentability Issued in PCT Application No. PCT/US2015/058695", dated Jan. 31, 2017, 7 Pages.

Yoo, et al., "SSD Characterization: From Energy Consumption's Perspective", In Proceedings of the 3rd USENIX conference on hot topics in storage and file systems, Jun. 4, 2011, 5 pages.

Najeeb, et al., "Power Virus Generation Using Behavioral Models of Circuits", In Proceeding of 25th IEEE VLSI Test Symposium, May 6, 2007, 6 pages.

Handy, Jim, "How Controllers Maximize SSD Life", Published on: Jan. 2013, Available at: http://www.snia.org/sites/default/files/SSSITECHNOTES_HowControllersMaximizeSSDLife.pdf.

Abraham, Michael, "Improving Power Budgeting Estimates in NAND Applications", Published on: Aug. 2009, Available at: https://www.micron.com/-/media/documents/products/presentation/fms09_improving_power_budgeting_estimates_in_nand_applications_mabraham.pdf.

Eshghi, et al., "SSD Architecture and PCI Express Interface", In Springer Series in Advanced Microelectronics, Retrieved on: Jun. 20, 2014, 27 pages.

Mohan, Vidyabhushan, "Modeling the Physical Characteristics of NAND Flash Memory", In Thesis in partial fulltillment of the requirement for the degree of Master of Science, May 2010, 68 pages.

"International Search Report and Written Opinion Issued in PCT Application No. PCT/US2015/058695", dated Feb. 16, 2016, 12 Pages.

Restriction Requirement, U.S. Appl. No. 14/532,646, dated May 11, 2016, pp. 18.

Non-Final Office Action, U.S. Appl. No. 14/532,646, dated Feb. 10, 2016, pp. 6.

Notice of Allowance, U.S. Appl. No. 14/532,646, dated Sep. 16, 2016, pp. 67.

"Second Written Opinion Issued in PCT Application No. PCT/US2015/058695" dated Oct. 12, 2016, 7 Pages.

"First Office Action and Search Report Issued in Chinese Patent Application No. 201580060171.6", dated Feb. 28, 2019, 13 Pages.

"Office Action Issued in European Patent Application No. 15794749.0", dated Jun. 13, 2019, 4 Pages.

"Office Action Issued in Chinese Patent Application No. 201580060171.6", dated Oct. 12, 2019, 19 Pages.

* cited by examiner

TESTING STORAGE DEVICE POWER CIRCUITRY

CROSS-REFERENCE TO RELATED APPLICATIONS

This application is a divisional of and claims the benefit of and priority to U.S. patent application Ser. No. 14/532,646, entitled "Testing Storage Device Power Circuitry", filed Nov. 4, 2014 by Laura Marie Caulfield et al, the entire contents of which are expressly incorporated by reference.

BACKGROUND

Background and Relevant Art

Solid State Drive (SSD) makers often design power circuits based on maximum current specifications in NAND datasheets. A NAND datasheet can include the maximum Root Mean Square (RMS) current for a NAND. However, NAND data sheets typically include little, if any, additional information about power characteristics of a NAND.

During operation, true current draw of NAND chips frequently exhibits spikes approaching 3×RMS current (and can potentially be even higher). For example, current spikes across several dies in an SSD NAND array may occur simultaneously. Simultaneous current spikes can break the SSD's power circuity causing the SSD to fail. Based solely on information in a NAND datasheet, a circuit designer may be unaware of the potential magnitude of current spikes.

Standard testing techniques can be used to obtain some additional power characteristics information for a NAND. However, standard testing techniques rarely catch damaging power conditions caused by simultaneous power spikes because host-generated workloads typically do not specifically exercise multiple (or all) NAND dies at once.

BRIEF SUMMARY

The present invention extends to methods, systems, and computer program products for testing storage device power circuitry. A storage device controller includes controller firmware and controller storage. A test program is embedded in the storage device controller. In one aspect, the storage device controller receives a command to initiate a power test. The storage device controller executes the test program in response to receiving the command. The test program accesses a test matrix. The test matrix includes a plurality of storage device component command patterns (e.g., NAND command patterns).

The test program uses the test matrix to test power capabilities of shared power circuitry shared by the plurality of storage device components (e.g., shared by an array of NAND flash memory devices). Each command pattern in the plurality of command patterns is issued from the controller to the plurality of storage device components. The command pattern that causes the greatest total current draw in shared power circuitry is identified.

In another aspect, a storage device controller receives a command to initiate a specified storage device component command pattern (e.g., a specified NAND command pattern). A test program accesses the specified storage device component command pattern in response to receiving the command. The test program tests the power characteristics of one or more storage device components by issuing the specified storage device component command pattern from the storage device controller to the one or more storage device components. It may be that the specified storage device component command pattern is issued a plurality of times.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific implementations thereof which are illustrated in the appended drawings. Understanding that these drawings depict only some implementations of the invention and are not therefore to be considered to be limiting of its scope, the invention will be described and explained with additional specificity and detail through the use of the accompanying drawings in which.

DETAILED DESCRIPTION

Figure 1:
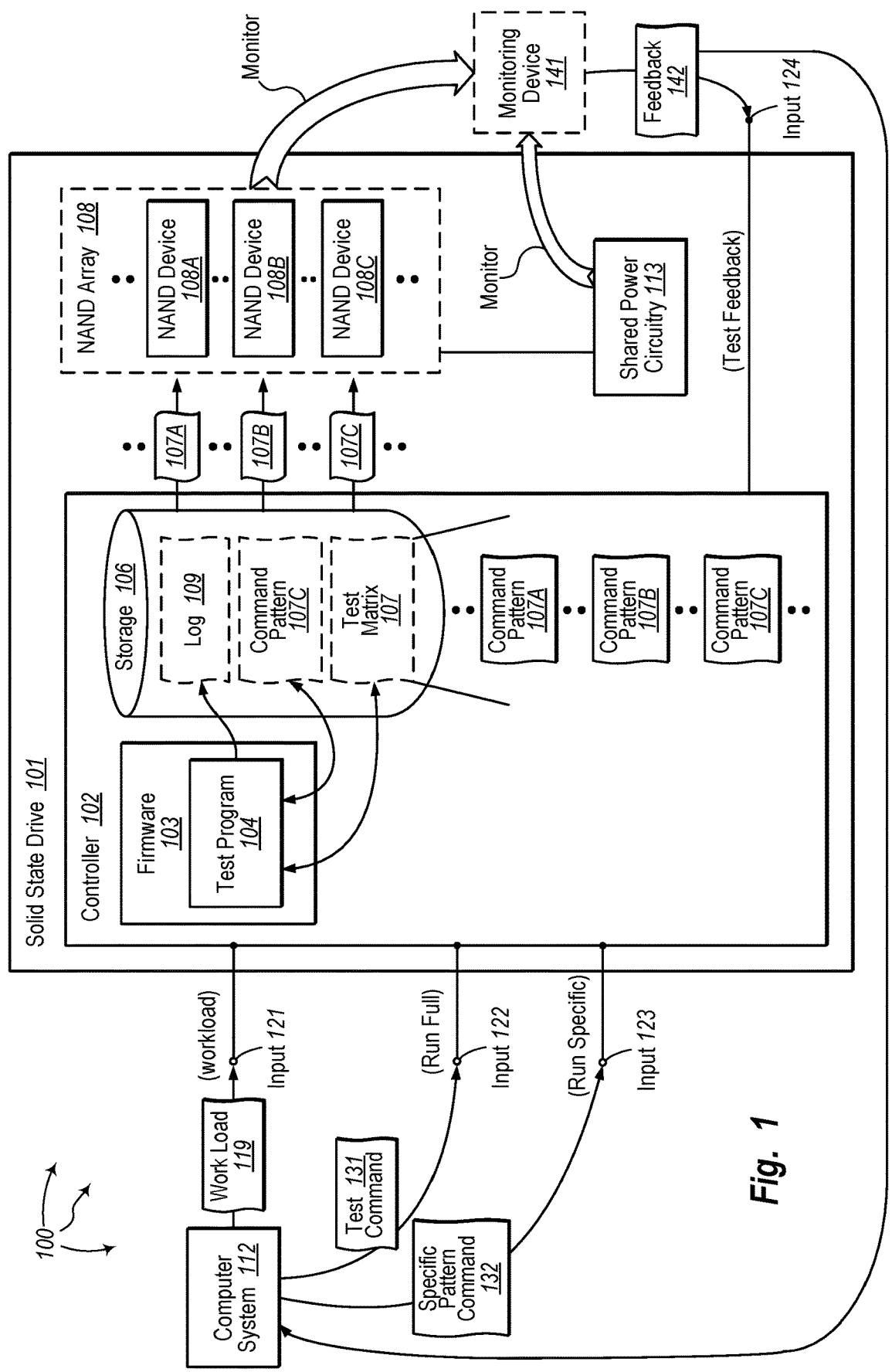
FIG. 1 illustrates an example computer architecture that facilitates testing storage device power circuitry.

The present invention extends to methods, systems, and computer program products for testing storage device power circuitry. In one aspect, a storage device controller includes controller firmware and controller storage. A test program is embedded in the storage device controller. The storage device controller receives a command to initiate a power test. The storage device controller executes the test program in response to receiving the command. The test program accesses a test matrix. The test matrix includes a plurality of storage device component command patterns (e.g., NAND command patterns).

The test program uses the test matrix to test power capabilities of shared power circuitry shared by the plurality of storage device components (e.g., shared by an array of NAND flash memory devices). Each command pattern in the plurality of command patterns is issued from the controller to the plurality of storage device components. The command pattern that causes the greatest total current draw in shared power circuitry is identified.

In another aspect, a storage device controller receives a command to initiate a specified storage device component command pattern (e.g., a specified NAND command pattern). A test program accesses the specified storage device component command pattern in response to receiving the command. The test program tests the power characteristics of one or more storage device components by issuing the specified storage device component command pattern from the storage device controller to the one or more storage device components. It may be that the specified storage device component command pattern is issued a plurality of times.

Implementations of the present invention may comprise or utilize a special purpose or general-purpose computer including computer hardware, such as, for example, one or more processors and system memory, as discussed in greater detail below Implementations within the scope of the present invention also include physical and other computer-readable media for carrying or storing computer-executable instructions and/or data structures. Such computer-readable media can be any available media that can be accessed by a general purpose or special purpose computer system. Computer-readable media that store computer-executable instructions are computer storage media (devices). Computer-readable media that carry computer-executable instructions are transmission media. Thus, by way of example, and not limitation, implementations of the invention can comprise at least two distinctly different kinds of computer-readable media: computer storage media (devices) and transmission media.

Computer storage media (devices) includes RAM, ROM, EEPROM, CD-ROM, solid state drives ("SSDs"), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry desired program code means in the form of computer-executable instructions or data structures and which can be accessed by a general purpose or special purpose computer. Combinations of the above should also be included within the scope of computer-readable media.

Further, upon reaching various computer system components, program code means in the form of computer-executable instructions or data structures can be transferred automatically from transmission media to computer storage media (devices) (or vice versa). For example, computer-executable instructions or data structures received over a network or data link can be buffered in RAM within a network interface module (e.g., a "NIC"), and then eventually transferred to computer system RAM and/or to less volatile computer storage media (devices) at a computer system. Thus, it should be understood that computer storage media (devices) can be included in computer system components that also (or even primarily) utilize transmission media.

Computer-executable instructions comprise, for example, instructions and data which, when executed at a processor, cause a general purpose computer, special purpose computer, or special purpose processing device to perform a certain function or group of functions. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, wearable devices, multi-processor systems, microprocessor-based or programmable consumer electronics, network PCs, minicomputers, mainframe computers, mobile telephones, PDAs, tablets, pagers, watches, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

The invention can also be implemented in cloud computing environments. In this description and the following claims, "cloud computing" is defined as a model for enabling on-demand network access to a shared pool of configurable computing resources. For example, cloud computing can be employed in the marketplace to offer ubiquitous and convenient on-demand access to the shared pool of configurable computing resources. The shared pool of configurable computing resources can be rapidly provisioned via virtualization and released with low management effort or service provider interaction, and then scaled accordingly.

A cloud computing model can be composed of various characteristics such as, for example, on-demand self-service, broad network access, resource pooling, rapid elasticity, measured service, and so forth. A cloud computing model can also expose various service models, such as, for example, Software as a Service ("SaaS"), Platform as a Service ("PaaS"), and Infrastructure as a Service ("IaaS"). A cloud computing model can also be deployed using different deployment models such as private cloud, community cloud, public cloud, hybrid cloud, and so forth. In this description and in the claims, a "cloud computing environment" is an environment in which cloud computing is employed.

In this specification and in the following claims, "flash memory" is defined as an electronic non-volatile computer storage medium that can be electrically erased and reprogrammed.

In this specification and the following claims, "NOR flash memory" is defined as flash memory where internal characteristics of individual flash memory cells exhibit characteristics similar to those of a NOR gate.

In this specification and the following claims, "NAND flash memory" is defined as flash memory where internal characteristics of individual flash memory cells exhibit characteristics similar to those of a NAND gate.

In this specification and in the following claims, a "solid state drive" is defined as a data storage device using integrated circuit assemblies to store data persistently. Integrated circuit assemblies of a solid state drive (SSD) can include NAND or NOR flash memory devices, which are used to store data.

In this specification and in the following claims, a "Universal Serial Bus (USB) flash drive" is defined as a data storage device using NAND flash memory devices with an integrated USB Interface.

FIG. 1 illustrates an example computer architecture 100 that facilitates testing storage device power circuitry. Referring to FIG. 1, computer architecture 100 includes solid state drive (SSD) 101 and computer system 112. Each of SSD 101 and computer system 112 can be connected to one another over (or be part of) a network, such as, for example, a system bus, a Local Area Network ("LAN"), a Wide Area Network ("WAN"), and even the Internet. Accordingly, each of SSD 101 and computer system 112, as well as any other connected computer systems and their components, can create message related data and exchange message related data (e.g., system bus messages, Internet Protocol ("IP") datagrams and other higher layer protocols that utilize IP datagrams, such as, Transmission Control Protocol ("TCP"), Hypertext Transfer Protocol ("HTTP"), Simple Mail Transfer Protocol ("SMTP"), etc., other non-datagram protocols, etc.) over the network.

As depicted, solid state drive (SSD) 101 further includes controller 102, NAND array 108, and shared power circuitry 113. Controller 102 includes firmware 103 and storage 106. NAND array 108 includes a plurality of NAND flash memory devices, including NAND devices 108A, 108B, 108C, etc. NAND devices 108A, 108B, 108C, etc. can be used to persistently store data at SSD 101. NAND devices 108A, 108B, 108C, etc. each receive power from shared power circuitry 113.

Controller 102 can be a processor that executes firmware-level code to perform various functions, such as, for example, error corrections, wear leveling, bad block mapping, read scrubbing, read and write caching, garbage collection, etc.

SSD 101 also includes inputs 121, 122, 123, and 124,

In general, other devices can submit workloads to SSD 101 through input 121. For example, computer system 112 can submit workload 119 to SSD 101 through input 121. A workload can indicate that data (e.g., a file) is to be stored, moved, copied, read, erased, overwritten, etc. within NAND array 108. Controller 102 can translate a workload into corresponding NAND commands. For example, controller 102 can translate workload 119 into one or more NAND commands Controller 102 can send the NAND commands to NAND array 108 to implement the intent expressed in workload 119. NAND commands for implementing a workload can include read, write, and erase, as well as any other commands that transfer data between a controller and a NAND array.

Firmware 103 includes test program 104. Test program 104 can be executed to test power characteristics of NAND array 108 or one or more NAND devices included therein. In one aspect, test program 104 includes executable code for generating a text matrix during execution. In another aspect, test program 104 refers to a test matrix in storage 106, such as, for example, test matrix 107.

A test matrix can contain a plurality of different command patterns that can be issued to NAND array 108 or one or more NAND devices included therein. Each different command pattern can include a different combination of NAND commands (e.g., write, read, erase, etc.) to be issued in a specified sequence and/or with a specified timing to NAND array 108 or one or more NAND devices included therein. NAND array 108 can receive a command pattern and implement the command pattern across one or more (and potentially all) NAND devices.

In one aspect, of different command patterns in a test matrix, at least one command pattern causes a higher current draw in) NAND array 108 and/or shared power circuitry 113 relative to other command patterns in the test matrix. The command pattern causing a higher current draw can be identified and possibly stored separately in storage 106. In another aspect, during issue of command patterns, a command pattern can cause sufficiently high current draw to cause NAND array 108 and/or shared power circuitry 113 to malfunction or otherwise operate in an unintended manner. The command pattern causing a malfunction or unintended operation can be identified and possibly stored separately in storage 106 (e.g., in log 109).

Other devices, such as, for example, computer system 112, can submit requests to run through command patterns in a test matrix to input 122. Controller 102 can detect a request at input 122 and initiate test program 104 to run through each command pattern in a text matrix. Other devices, such as, for example, computer system 112, can submit requests to run a specified command pattern (or specified subset of command patterns) to input 123. Controller 102 can detect a request at input 123 and initiate test program 104 to run a specific command pattern (or specific subset of command patterns). In one aspect, when a request is detected at input 123, controller 102 initiates test program 104 to run a command pattern previously identified to cause a higher current draw in NAND array 108 and/or shared power circuitry 113. In another aspect, when a request is detected at input 123, controller 102 initiates test program 104 to run a command pattern previously identified to cause a malfunction or unintended operation at NAND array 108 and/or shared power circuitry 113.

Test program 104 can be used in a qualification setting or production setting to test power characteristics of NAND array 108 and/or shared power circuitry 113. An external monitoring device, such as, for example, a meter or scope, can be electrically connected to NAND array 108 and/or to shared power circuitry 113. The external monitoring device can monitor electrical characteristics at components of NAND array 108 and/or shared power circuitry 113 as different command patterns are implemented at NAND array. An external monitoring device can submit feedback to input 124. Controller 102 can receive feedback from external monitoring devices at input 124. Controller 102 can store feedback (or portions thereof) in storage 106, such as, for example, in log 109. In one aspect, a command pattern is stored along with power characteristics of NAND 108 monitored during implementing of the command pattern.

Figure 2:
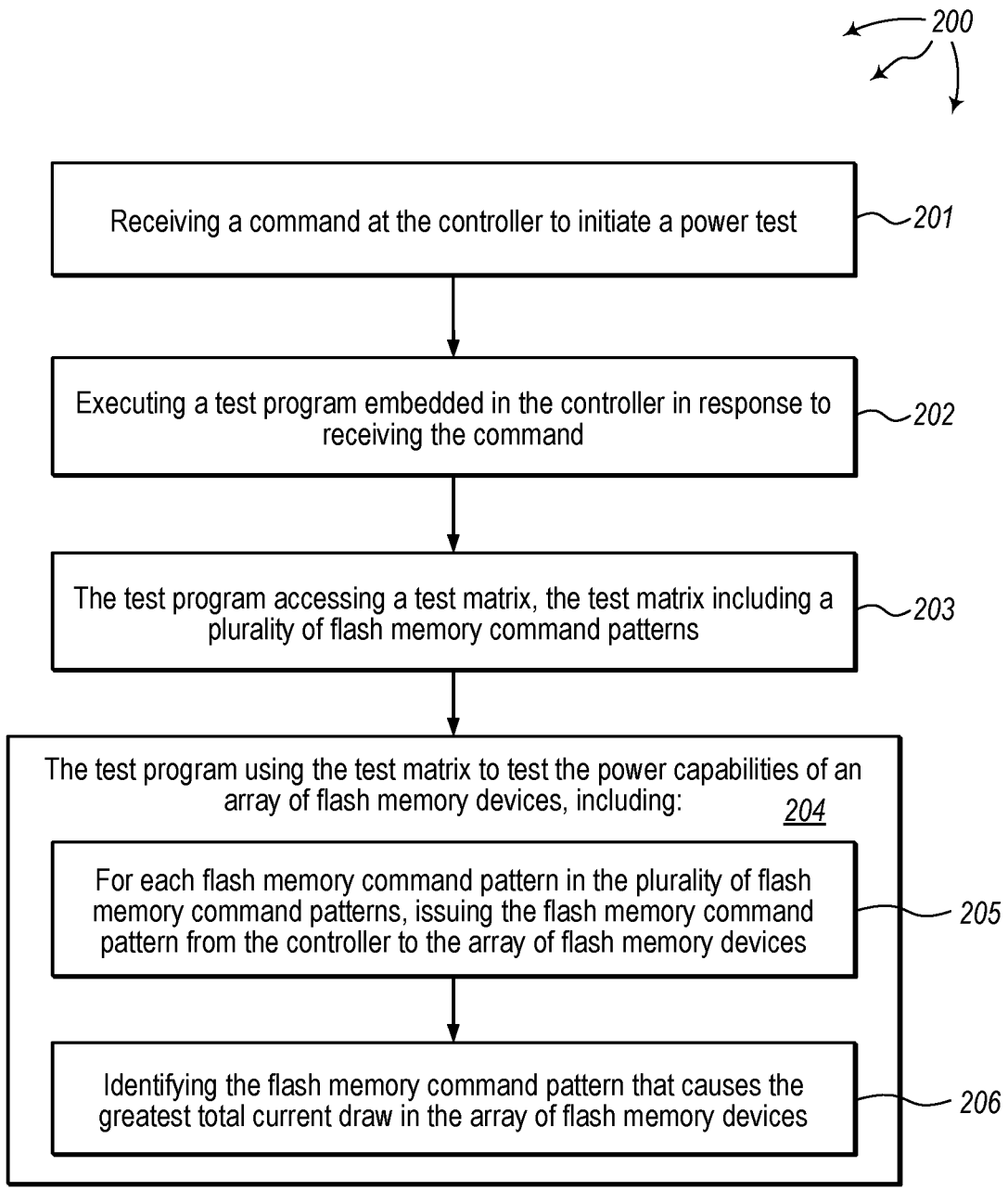
FIG. 2 illustrates a flow chart of an example method for testing storage device power circuitry.

FIG. 2 illustrates a flow chart of an example method 200 for testing storage device power circuitry. Method 200 will be described with respect to the components and data of computer architecture 100.

Method 200 includes receiving a command at the controller to initiate a power test (201). For example, computer system 112 can send test command 131 to input 122. Controller 102 can receive test command 131 at input 122. Method 200 includes executing a test program embedded in the controller in response to receiving the command (202). For example, controller 102 can execute test program 104 (embedded in firmware 103) in response to test command 131.

Method 200 includes the test program accessing a test matrix, the test matrix including a plurality of flash memory command patterns (203). For example, in one aspect, test program 104 accessing test matrix 107 from storage 106. As described, test matrix 107 includes command patterns 107A, 107B, 107C, etc. Alternately, in another aspect, test program 104 executes a portion of executable code to generate test matrix 107.

Method 200 includes the test program using the test matrix to test the power capabilities of an array of flash memory devices (204). For example, test program 104 can use test matrix 107 to test the power capabilities of NAND array 108 and/or shared power circuitry 113.

Testing the power capabilities of the array of flash memory devices, includes for each flash memory command pattern in the plurality of flash memory command patterns, issuing the flash memory command pattern from the controller to the array of flash memory devices (205). For example, test program 104 can issue each of command patterns 107A, 107B, 107C, etc. to NAND array 108. NAND array 108 can attempt to implement command patterns 107A, 107B, 107C, etc. as each of command patterns 107A, 107B, 107C, etc. is received. As described, a command pattern can include a timed sequence of NAND commands, including reads, writes, erases, and any other commands that transfer data between a controller and a NAND array.

Monitoring device 141, such as, for example, a meter or scope, can be electrically connected to shared power circuitry 113 and/or to power circuitry of individual NAND devices 108A, 108B, 108C, etc. Monitoring device 141 can monitor power characteristics at the shared power circuitry 113 and/or at power circuitry of individual NAND devices as command patterns are implemented. Monitoring device 141 can send feedback 142 (e.g., a measured current draw on power circuitry) to input 124 and/or to another computer system (e.g., computer system 112). Controller 102 can receive feedback 142 at input 124. Test program 124 can record a command pattern and corresponding feedback for the command pattern in log 109.

Monitoring device 141 can be included in or separate from computer system 112.

Computer system 112 and/or another computer system can also maintain command patterns and corresponding feedback 142 for subsequent use and analysis.

Testing the power capabilities of the array of flash memory devices includes identifying the flash memory command pattern that causes the greatest total current draw in the array of flash memory devices (206). For example, based on feedback 142 for various different command patterns, test program 104 (or a module at computer system 112 or at some other computer system) can identify command pattern 107C as the command pattern that causes the greatest total current draw in NAND array 108 and/or shared power circuitry 113.

Test program 104 can store command pattern 107C separately in storage 106 (and/or can send an indication of command pattern 107C to computer system 112 or some other computer system). Command pattern 107C can then be used to more rigorously test power capabilities of NAND array 108. For example, command pattern 107C can be (repeatedly) issued to NAND array 108 at specified intervals (e.g., on the order of microseconds or milliseconds) over a period of time.

As such, test program 104 can essentially search test matrix 107 to identify a command pattern causing higher current draw in NAND array 108 and/or shared power circuitry 113. Test program 104 can also search test matrix 107 to identify any command patterns that cause malfunctions or other unintended operations at NAND array 108 and/or at shared power circuitry 113. For example, test program 104 can systematically progress through a maximum number of NAND devices operating each type of operation (e.g., read, write, erase, and any other commands that transfer data between a controller and a NAND array).

An array of flash memory devices (e.g., a NAND array) may be able to operate as intended when implementing any of one or more command patterns causing higher current draw. As such, test program 104 can identify the command pattern causing the highest possible current draw in an array of flash memory devices (e.g., a NAND array) relative to other command patterns. On the other hand, there may be any number of command patterns that when implemented cause an array of flash memory devices (e.g., a NAND array) and/or shared power circuitry to malfunction or otherwise operate in an unintended manner (e.g., due to current draw exceeding capabilities of electrical components). Test program 104 can identify any command patterns that cause a malfunction or other unintended operation in an array of flash memory devices and/or shared power circuitry.

In one aspect, test matrix 107 is configured to exercise a case where all flash memory devices in an array (e.g., NAND array 108) are activated in order to more fully test power circuit design of SSD 101.

Figure 3:
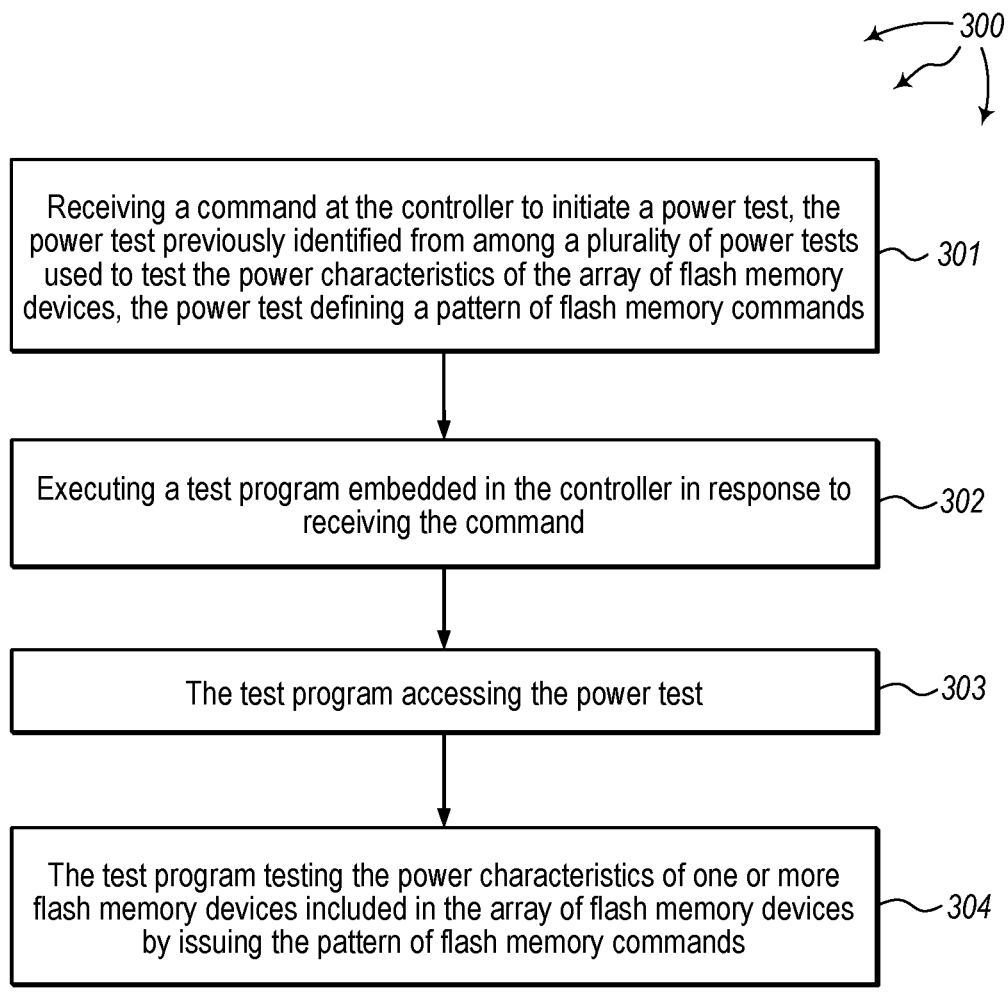
FIG. 3 illustrates a flow chart of an example method for testing storage device power circuitry.

FIG. 3 illustrates a flow chart of an example method 300 for testing storage device power circuitry. Method 300 will be described with respect to the components and data of computer architecture 100.

Method 300 includes receiving a command at the controller to initiate a power test, the power test previously identified from among a plurality of power tests used to test the power characteristics of the array of flash memory devices, the power test defining a pattern of flash memory commands (301). For example, computer system 112 can send specific pattern command 132 to input 123. Controller 102 can receive specific pattern command 132 at input 123. Specific pattern command 132 can be a command to initiate a specified command pattern previously identified from test matrix 107.

In one aspect, specific pattern command 132 requests that a command pattern causing a higher current draw is to be issued. For example, specific pattern command 132 may be a command to initiate command pattern 107C. Specific pattern command 132 can specifically identify command pattern 107C. Alternately, input 123 can be specifically configured for triggering initiation of an identified higher current draw command pattern when a request is detected at input 123.

In other aspects, input 123 can be used to identify any command pattern contained in test matrix 107 (whether test matrix 107 is stored separately or generated by test program 104 at runtime).

Method 300 includes executing a test program embedded in the controller in response to receiving the command (302). For example, controller 102 can execute test program 104 (embedded in firmware 103) in response to receiving specific pattern command 132. Method 300 includes the test program accessing the power test (303). For example, test program 104 can access command pattern 107C (or some other specified command pattern). Test program 104 can access command pattern 107C (or some other specified command pattern) from storage 106. Alternately, test program 104 can generate command pattern 107C (or some other specified command pattern) at runtime.

Method 300 includes the test program testing the power characteristics of one or more flash memory devices included in the array of flash memory devices by issuing the pattern of commands from the controller to the one or more flash memory devices (304). For example, controller 102 can issue command pattern 107C to NAND array 108 or one or more NAND devices included therein to test one or more of: the power characteristics of NAND array 108, the power characteristics of one or more NAND devices included therein, and the power characteristics of shared power circuitry 113. NAND array 108 or one or more NAND devices included therein can implement command sequence 107C. As described, a command pattern can include a timed sequence of NAND commands, including reads, writes, erases, and any other commands that transfer data between a controller and a NAND array.

In one aspect, controller 102 repeatedly issues command pattern 107C to NAND array 108 at specified intervals (e.g., on the magnitude of microseconds or milliseconds). Monitoring device 141 can monitor power characteristics of NAND array 108 and/or shared power circuitry 113 over time as command pattern 107C is repeatedly implemented at NAND array 108. Monitoring device 141 can provide feedback to controller 102.

Aspects of the invention are also applicable to test NAND arrays contained in Universal Serial Bus (USB) flash drives. A test program can be embedded in a USB controller. The test program can issue command patterns (possibly from a test matrix) to NAND devices in the USB flash drive. Command patterns causing higher current draw, causing malfunctions, or causing other unintended operations can be recorded.

Aspects of the invention can also be used to test power components of other types of storage devices, such as, for example, magnetic drives, optical drives, NOR based flash memory, etc. In one aspect, a test program is embedded in firmware in a controller of a magnetic hard drive. The test program can issue different command patterns to exercise shared power circuitry shared among plurality of components of the magnetic hard drive. The test program can also use different command patterns to exercise a read/write head across one or more platters. Command patterns causing higher current draw, malfunctions, or other unintended operations can be recorded.

Aspects of the invention can be tuned to account for limitations at a storage device. A test developer can consider limits on the number of in-flight operations when designing a test program and/or test matrix. For example, it may be that a controller's buffer space can accommodate a specified number of in-flight reads. As such, the test program can be designed to limit the specified number of NAND devices active with one type of operation (e.g., a read operation), but have other NAND devices active with other types of operations. The test program can also be designed to consider whether data transfer and flash operations use the same power rail.

The present invention may be implemented in other specific forms without departing from its spirit or essential characteristics. The described implementations are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed:

1. A method for use at a storage device, the storage device including a plurality of flash memory devices, the method comprising:
   receiving a request to initiate a power test for testing power characteristics of the plurality of flash memory devices; and
   in response to the request:
      accessing a plurality of memory command patterns for testing the plurality of flash memory devices;
      for each memory command pattern in the plurality of memory command patterns, implementing the memory command pattern at the plurality of flash memory devices;
      identifying the memory command pattern, from among the plurality of memory command patterns, the implementation of which caused the greatest total current draw by the plurality of flash memory devices; and
      issuing the identified memory command pattern to the plurality of flash memory devices repeatedly over a period of time.

2. The method of claim 1, wherein the storage device includes shared circuitry shared among the plurality of flash memory devices, and wherein implementing the memory command pattern at the plurality of flash memory devices comprises implementing the memory command pattern to cause a current increase at each of the plurality of flash memory devices to align with one another so as to increase current draw on the shared circuitry.

3. The method of claim 2, wherein implementing the memory command pattern to cause a current increase at each of the plurality of flash memory devices to align with one another comprises implementing the memory command pattern to cause a current spike at each of the plurality of flash memory devices to align with one another.

4. The method of claim 1, further comprising:
   receiving a voltage measurement of a detected voltage at each of the plurality of flash memory devices during implementation of the memory command pattern; and
   determining if the plurality of flash memory devices operated appropriately under the detected voltage.

5. The method of claim 1, wherein implementing the memory command pattern at the plurality of flash memory devices comprises implementing the memory command pattern at a plurality of NAND flash memory devices.

6. The method of claim 1, wherein implementing the memory command pattern at the plurality of flash memory devices comprises implementing a memory command pattern that includes at least one of the following: a write command, a read command, or an erase command.

7. The method of claim 1, wherein implementing the memory command pattern at the plurality of flash memory devices comprises implementing the memory command pattern at the plurality flash memory devices a plurality of times.

8. A method for use at a storage device, the storage device including a plurality of flash memory devices, the method comprising:
   receiving a request to initiate a power test for testing power characteristics of shared circuitry shared among the plurality of flash memory devices; and
   in response to the request:
      accessing a plurality of patterns of memory commands to implement at the plurality of flash memory devices;
      implementing each of the plurality of patterns of memory commands at the plurality of flash memory devices;
      identifying the pattern of memory commands, from among the plurality of patterns of memory commands, the implementation of which caused the greatest total current draw; and issuing the identified memory command pattern to the plurality of flash memory devices repeatedly over a period of time.

9. The method of claim 8, wherein accessing a pattern of memory command comprises accessing a pattern of memory commands for testing shared circuitry shared among a plurality of NAND flash memory devices.

10. The method of claim 8, further comprising:
receiving a voltage measurement of a detected voltage at each of the plurality of flash memory devices during implementation of the pattern of memory commands; and
determining if the plurality of flash memory devices operated appropriately under the detected voltage.

11. The method of claim 10, wherein determining if the plurality of flash memory devices operated appropriately comprises comparing operational characteristics of the plurality of flash memory devices, operating under the detected voltage, to baseline operational characteristics of the plurality of flash memory devices, the baseline operational characteristics recorded during performance of the power test on the plurality of flash memory devices earlier in the lifetime of the plurality of flash memory devices.

12. The method of claim 8, wherein testing the power characteristics of the shared circuitry comprises implementing a pattern of memory commands that includes at least one of the following: a write command, a read command, or an erase command.

13. The method of claim 8, wherein accessing a pattern of memory commands comprises accessing a pattern of memory commands for a power test previously identified as causing a practical maximum current draw from the plurality of flash memory devices.

14. A solid state drive, the solid state drive comprising:
one or more hardware processors;
firmware coupled to the one or more hardware processors, the firmware storing instructions that are executable by the one or more hardware processors;
a plurality of flash memory devices;
shared circuitry shared among the plurality of flash memory devices;
the one or more hardware processors executing the instructions stored in the firmware to:
receive a request to initiate a power test for testing power characteristics of the plurality of flash memory devices; and
in response to the request:
access a plurality of memory command patterns;
for each memory command pattern in the plurality of memory command patterns, implement the memory command pattern at the plurality of flash memory devices;
identify the memory command pattern, from among the plurality of memory command patterns, the implementation of which was associated with the greatest total current draw from the plurality of flash memory devices; and
issue the identified memory command pattern to the plurality of flash memory devices repeatedly over a period of time.

15. The solid state drive of claim 14, further comprising the one or more hardware processors executing the instructions stored in the firmware to for each memory command pattern in the plurality of memory command patterns:
receive a voltage measurement of a detected voltage at each of the plurality of flash memory devices during implementation of the memory command pattern; and
determine if the plurality of flash memory devices operated appropriately under the detected voltage.

16. The solid state drive of claim 15, wherein the one or more hardware processors executing the instructions stored in the firmware to determine if the plurality of flash memory devices operated appropriately comprises the one or more hardware processors executing the instructions stored in the firmware to compare operational characteristics of the plurality of flash memory devices, operating under the detected voltage, to baseline operational characteristics of the plurality of flash memory devices, the baseline operational characteristics recorded during performance of the power test on the plurality of flash memory devices earlier in the lifetime of the plurality of flash memory devices.

17. A method according to claim 1,
wherein the identified memory command pattern is implemented at the plurality of flash memory devices at specified intervals over the period of time.

18. A method according to claim 8,
wherein the identified pattern of memory commands is implemented at the plurality of flash memory devices at specified intervals over the period of time.

19. A solid state drive according to claim 14,
wherein the identified memory command pattern is implemented at the plurality of flash memory devices at specified intervals over the period of time.

* * * * *